United States Patent
Shiue et al.

(10) Patent No.: US 7,042,925 B2
(45) Date of Patent: May 9, 2006

(54) CORRELATION DETECTION IMPROVEMENT BY AVERAGING SPREAD SPECTRUM SIGNALS

(75) Inventors: Dong-Chang Shiue, Carmel, IN (US); David Emery Virag, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 313 days.

(21) Appl. No.: 10/372,623

(22) Filed: Feb. 24, 2003

(65) Prior Publication Data
US 2004/0165656 A1    Aug. 26, 2004

(51) Int. Cl.
*H04L 27/30* (2006.01)
(52) U.S. Cl. ............... 375/142; 375/150; 375/368; 370/509
(58) Field of Classification Search ........... 375/140, 375/142, 150, 343, 367, 354, 368; 370/503, 370/509, 510–513
See application file for complete search history.

(56) References Cited

U.S. PATENT DOCUMENTS

| | | | |
|---|---|---|---|
| 5,894,494 A * | 4/1999 | Davidovici | 375/150 |
| 5,909,462 A | 6/1999 | Kamerman et al. | |
| 6,393,049 B1 | 5/2002 | Davidovici et al. | |
| 6,727,790 B1 | 4/2004 | Raphaeli et al. | |
| 6,754,194 B1 * | 6/2004 | Ramaswamy et al. | 370/331 |
| 6,795,490 B1 * | 9/2004 | Belotserkovsky | 375/150 |
| 6,907,094 B1 * | 6/2005 | Matsui et al. | 375/347 |

OTHER PUBLICATIONS

PCT Search Report for Appln. No. PCT/US03/41524 dated Apr. 26, 2004.

* cited by examiner

*Primary Examiner*—Dac V. Ha
(74) *Attorney, Agent, or Firm*—Joseph J. Laks; Robert B. Levy; Joseph J. Kolodka

(57) ABSTRACT

There is provided a correlation method for spread spectrum signals. Correlation peaks in packet headers included in the spread spectrum signals are detected by averaging known signals that repeat in the packet headers. Data corresponding to the spread spectrum signals is recovered based on the correlation peaks.

19 Claims, 13 Drawing Sheets

CORRELATION DETECTION IMPROVEMENT BY AVERAGING SPREAD SPECTRUM SIGNALS

FIELD OF THE INVENTION

The present invention generally relates to mobile communications and, more particularly, to a method and apparatus for correlating spread spectrum signals based on signal averaging.

BACKGROUND OF THE INVENTION

Spread spectrum communications may be based on, for example, Time Division Multiple Access (TMDA), Code Division Multiple Access (CDMA), and Frequency Division Multiple Access (FDMA). FIG. 1 is a diagram illustrating a data/voice Time Division Multiple Access (TDMA) communication structure 100, according to the prior art. TDMA, which is packet-based, assigns each call a certain portion of time on a designated frequency. FIG. 2 is a diagram illustrating a TDMA packet structure 200, according to the prior art.

Conventionally, the decoding of received signals in TDMA has involved correlating the received signals as they are being received. The decoding occurs in a serial fashion in the time domain. However, the start of a received packet has been very difficult to reliably determine. Accordingly, misdetection of the start of a received packet occurs with some frequency. This is particularly true in very low signal-to-noise (SNR) conditions and under various adverse signal impairments.

Accordingly, it would be desirable and highly advantageous to have an improved method and apparatus for correlation detection in spread spectrum signals. Such a method and apparatus should preferably be capable of accurately detecting the start of a received packet. Further, such a method and apparatus should preferably be able to accurately operate in very low SNR conditions and under various adverse signal impairments.

SUMMARY OF THE INVENTION

The problems stated above, as well as other related problems of the prior art, are solved by the present invention, an apparatus and method for correlating spread spectrum signals. The present invention correlates the spread spectrum signals based on the averaging of known signals (e.g., fixed patterns) that repeat in packet headers included in the spread spectrum signals.

According to an aspect of the present invention, there is provided a correlation method for spread spectrum signals. Correlation peaks in packet headers included in the spread spectrum signals are detected by averaging known signals that repeat in the packet headers. The spread spectrum signals are correlated based on the correlation peaks.

According to another aspect of the present invention, there is provided another correlation method for spread spectrum signals. The spread spectrum signals are correlated to obtain correlation values therefore. The correlation values are assigned to a plurality of bins. The correlation values in the plurality of bins are averaged to obtain averaged correlation values for the plurality of bins. Peaks are detected in the averaged correlation values. A bit stream corresponding to the spread spectrum signals is generated, based on the peaks and an average of known signals that repeat in packets headers included in the spread spectrum signals.

These and other aspects, features and advantages of the present invention will become apparent from the following detailed description of preferred embodiments, which is to be read in connection with the accompanying drawings.

DETAILED DESCRIPTION OF THE INVENTION

Figures 1, 2:
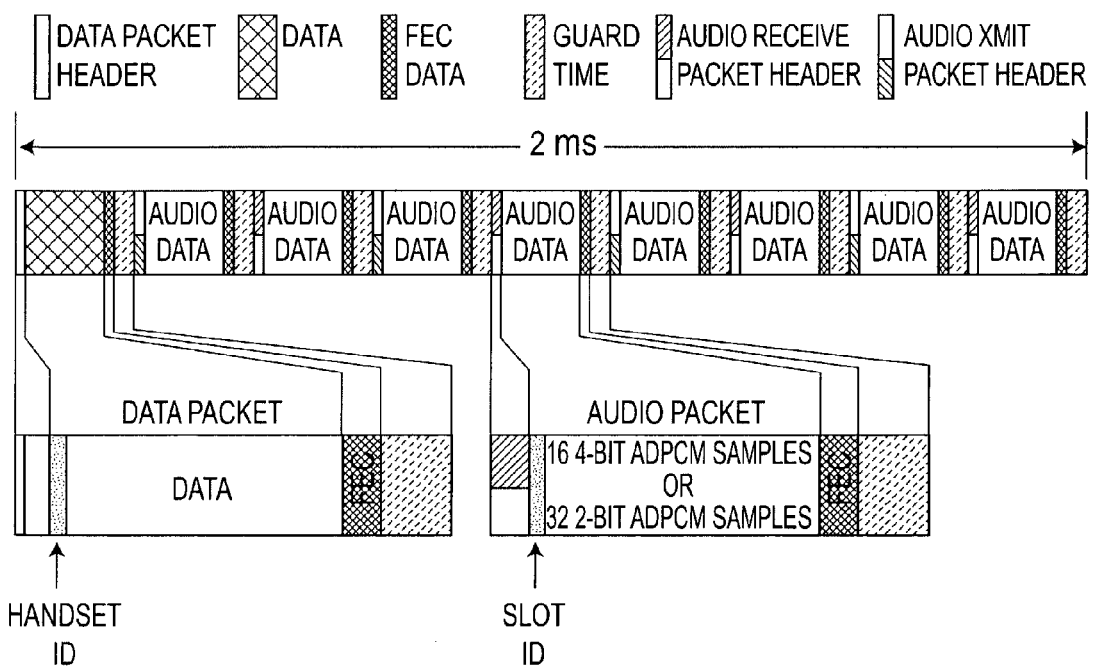
FIG. 1 is a diagram illustrating a data/voice Time Division Multiple Access (TDMA) communication structure 100, according to the prior art.
FIG. 2 is a diagram illustrating a TDMA packet structure 200, according to the prior art.

The present invention is directed to an apparatus and method for correlating spread spectrum signals in a spread spectrum system. The present invention correlates the spread spectrum signals based on the averaging of known signals that repeat in packet headers included in the spread spectrum signals. The present invention may be employed, for example, in the receiver portion of a spread spectrum system. Such a system may be, for example, a cellular system wherein mobile units communicate with base stations. Of course, the present invention may be applied to other types of spread spectrum systems, while maintaining the spirit and scope of the present invention.

It is to be understood that the present invention may be implemented in various forms of hardware, software, firmware, special purpose processors, or a combination thereof. Preferably, the present invention is implemented as a combination of hardware and software. Moreover, the software is preferably implemented as an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Thus, the present invention provides a method and apparatus for improving correlation detection for spread spectrum signals based on signal averaging. The present invention may be applied to any type of spread spectrum signal including, but not limited to, Time Division Multiple Access (TDMA) signals (e.g., Global System for Mobile Communications (GSM) and Personal Digital Cellular (PDC)), Code Division Multiple Access (CDMA) signals, Frequency Division Multiple Access (FDMA) signals, and so forth. This general applicability of the present invention is a result of the fact that the systems that utilize spread spectrum signals are typically packet-based and employ known signals that repeat (e.g., fixed patterns) in the packet headers included in the spread spectrum signals. It is these repetitive, known signals to which the present invention is applied. However, for illustrative purposes, the present invention will be described with respect to TDMA.

In TDMA, the header packets that are transmitted by the base station always include certain fixed patterns (fixed bit pattern mapped to fixed symbols). The present invention takes advantage of this repetitive pattern to improve the timing synchronization. For example, the present invention can be applied to average the entire field shown in FIG. 1 on a sample-by-sample basis.

To illustrate the present invention, two illustrative approaches are described herein that achieve improved timing synchronization performance in the receipt of spread spectrum signals as compared to the prior art. In the first illustrative approach, received samples are integrated over a pre-determined number of packets or fields. In the second approach, a moving integration (or average) is performed of the received samples over a pre-determined number of packets or fields. It is to be appreciated that the present invention however, can also be applied to average the correlation bins in a similar fashion. Moreover, it is to be further appreciated that given the teachings of the present invention provided herein, one of ordinary skill in the related art will contemplate these and various other approaches to averaging repetitive TDMA signals, while maintaining the spirit and scope of the present invention.

Figure 3A:
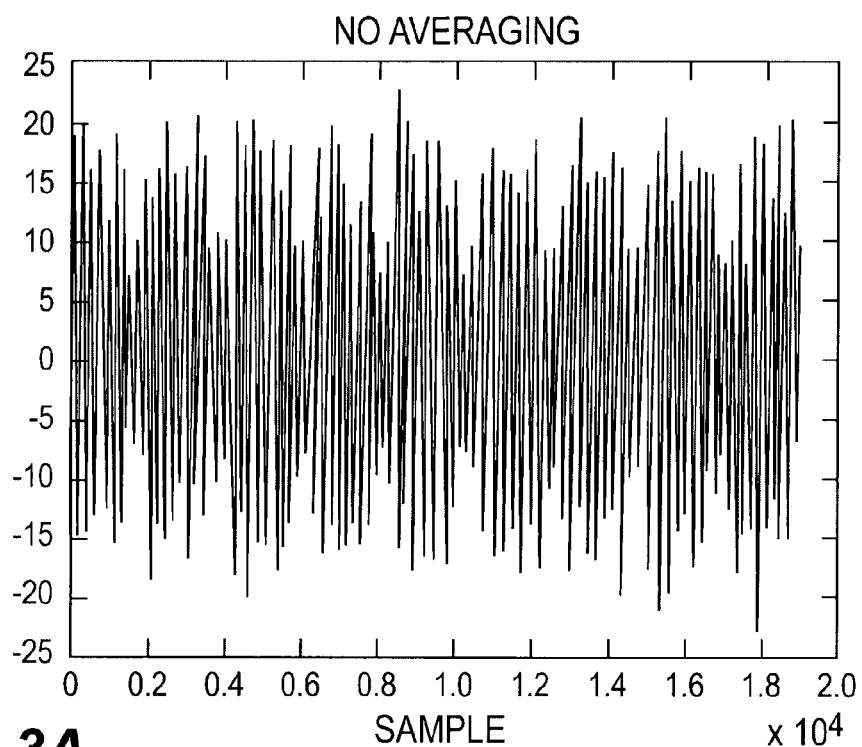
FIG. 3A. is a diagram illustrating correlation detection results obtained by the prior art.
Figure 3B:
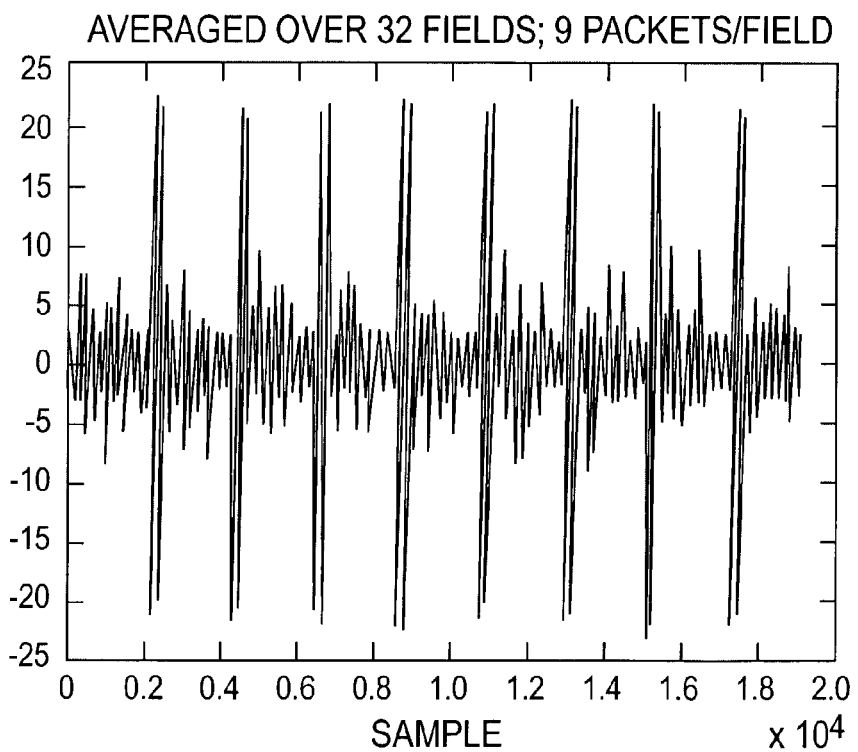
FIG. 3B is a diagram illustrating correlation detections results obtained by the present invention.

As shown in FIG. 2, fixed patterns can occur at the beginning of each active packet—transmit or receive. By averaging over several fields, a profile can be obtained and correlation detection can be improved over the prior art. FIG. 3A is a diagram illustrating correlation detection results obtained by the prior art, and FIG. 3B is a diagram illustrating correlation detections results obtained by the present invention. As is evident from a comparison of FIGS. 3A and 3B, the present invention provides a significant advantage over the prior art in detecting correlation peaks, timing errors, and so forth.

In the example of FIG. 2, the first 16 bits of data are not forward error correction (FEC) encoded. These 16 bits are mapped to 8 transmitted symbols through a Quadrature Phase Shift Keying/Differential Quadrature Phase Shift Keying (QPSK/DQPSK) mapper. The first 4 symbols indicate whether this packet is transmitted by a base station or a mobile unit. The next 4 symbols indicate whether this packet is transmitted with strong or weak FEC. These 8 symbols of each packet have been re-enforced by averaging, as shown in FIG. 3B. It should be noted that although an FEC mode of strong or weak may be changed during communication, such a change is rare and occurs only from one 4-symbol pattern to another. Thus, the present invention may still advantageously be employed. The only effect of changing the FEC mode during communication is that the second 4 symbols of the header may not be re-enforced during the FEC mode transition, but the first 4 symbols are always constant.

Figure 4A:
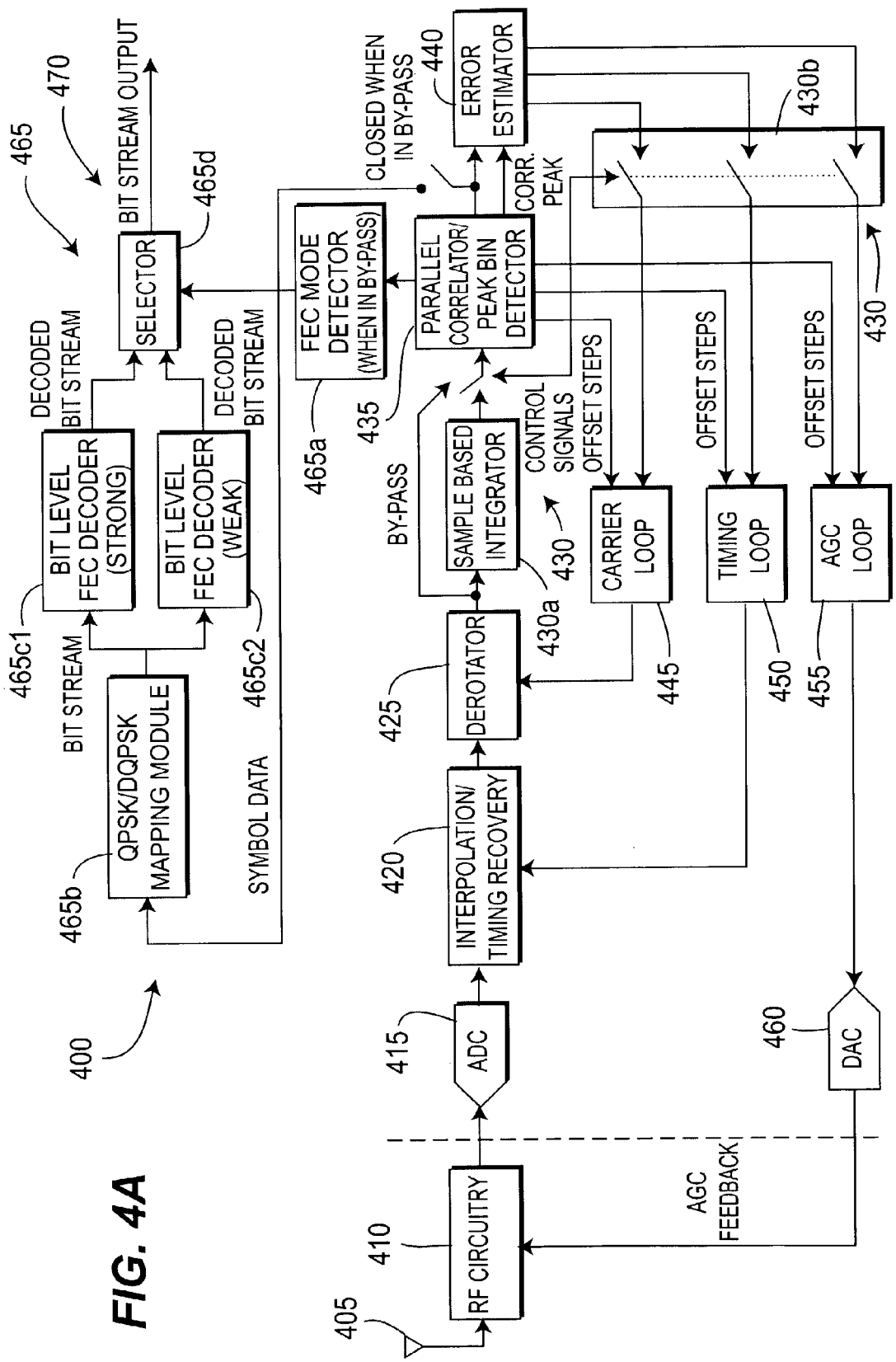
FIG. 4A is a block diagram illustrating a Time Division Multiple Access (TDMA) receiver 400 that employs sample-based averaging, according to an illustrative embodiment of the present invention.

FIG. 4A is a block diagram illustrating a Time Division Multiple Access (TDMA) receiver 400 that employs sample-based averaging, according to an illustrative embodiment of the present invention. The TDMA receiver 400 includes an antenna 405, RF circuitry 410, an Analog-to-Digital Converter (ADC) 415, an interpolation/timing recovery module 420, a derotator 425, a sample-based integrator apparatus 430, a parallel correlator/peak bin detector 435, an error estimation module 440, a Carrier Tracking Loop (CTL) 445, a Symbol Timing Recovery (STR) loop 450, an Automatic Gain Control (AGC) loop 455, and a Digital-to-Analog Converter (DAC) 460. It is to be appreciated that while a single ADC and DAC are shown in FIG. 4A, more than one ADC and/or DAC may also be employed, while maintaining the spirit and scope of the present invention. The sample-based integrator apparatus 430 includes a sample-based integrator 430a and a plurality of switches 430b. In a preferred embodiment of the present invention, the switches 430b are controlled independent of one another. Of course, other configurations are possible while maintaining the spirit and scope of the present invention.

Moreover, the TDMA receiver 400 includes an FEC mode detection apparatus 465. The FEC mode detection apparatus 465 operates only during a by pass mode of the sample-based integrator apparatus 430 because the FEC information and payload date are "destroyed" by averaging received samples. The FEC mode detection apparatus 465 includes an FEC mode detector 465a, a QPSK/DQPSK mapping module 465b, a bit level FEC decoder (strong) 465c1, a bit level FEC decoder (weak) 465c2, and a selector 465d. A recovery circuit 470 for recovering the underlying data corresponding to the spread spectrum signals is formed from at least a portion of the FEC mode detection apparatus 465. For example, the recovery circuit 470 may include elements 465b, 465c1, 465c2, and 465d. Of course, other variations are possible (e.g., one decoder, more than two, etc.) while maintaining the spirit and scope of the present invention.

When the TDMA receiver 400 is in an initial acquisition mode, the parallel correlator/peak bin detector 435 switches off the closed loops and run the entire TDMA receiver 400 in open loops with averaging (integrating) until reliable and repetitive correlation peaks are found. A state machine or a simple microprocessor can be used to determine whether reliable correlation peaks have been constantly received and to open/close the loops. The averaging block (sample based integrator apparatus 430) shall be by-passed when all three loops (CTL 445, STR loop 450, AGC loop 455) are closed so that the real symbols can be correlated.

The offset step values can be programmed into accumulators in each of the loops. For example, the timing offset value is increased (or decreased) by a fixed small amount until reliable correlation peaks can be received. Since the error signals for the CTL 445, STR loop 450, and AGC loop 455 are estimated from the received correlation peaks, averaging/integration according to the present invention can greatly improve acquisition performance.

It should be noted here that although the averaging block (sample based integrator apparatus 430) is by-passed when reliable correlation peaks are received, the averaging block can continue to function to provide averaged and SNR-improved error signals for all loops and accurate beginnings of the packets or fields. The TDMA receiver 400, however, will require an additional parallel correlator such that one parallel correlator is used to correlate the received samples for the FEC and the other parallel correlator is used to correlate the averaged samples for better error estimates.

Figure 4B:
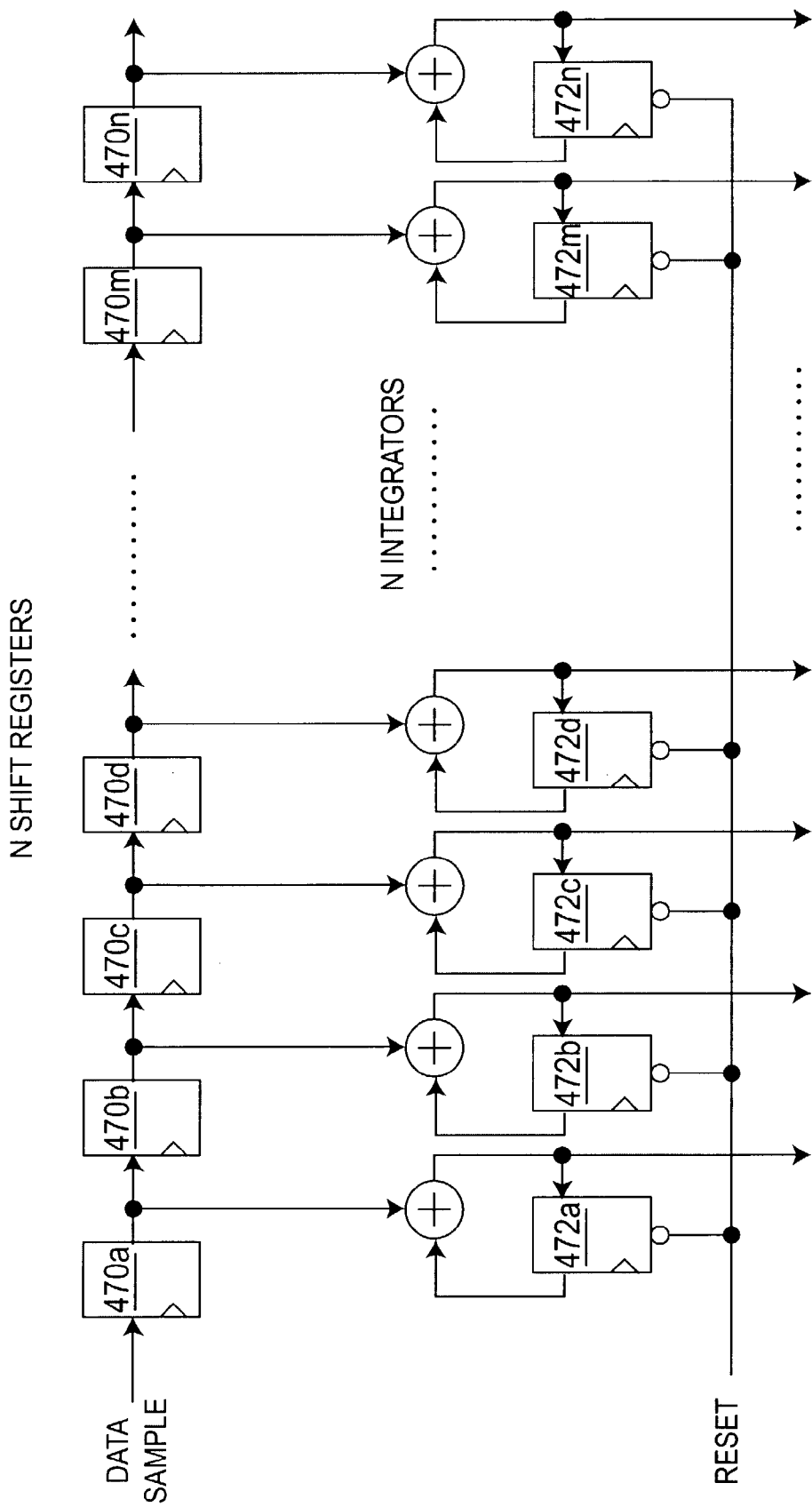
FIG. 4B is a diagram illustrating the sample-based integrator 430a of FIG. 4A, according to an illustrative embodiment of the present invention.

FIG. 4B is a diagram illustrating the sample-based integrator 430a of FIG. 4A, according to an illustrative embodiment of the present invention. The sample-based integrator 430a includes 470a through 470n shift registers and 472a through 472n integrators. Samples are averaged over M packets or fields. Additions are performed when N shift registers are filled with new N samples. Given the teachings of the present invention provided herein, one of ordinary skill in the related art will contemplate this and various other configurations of a sample-based integrator, while maintaining the spirit and scope of the present invention.

Figure 5:
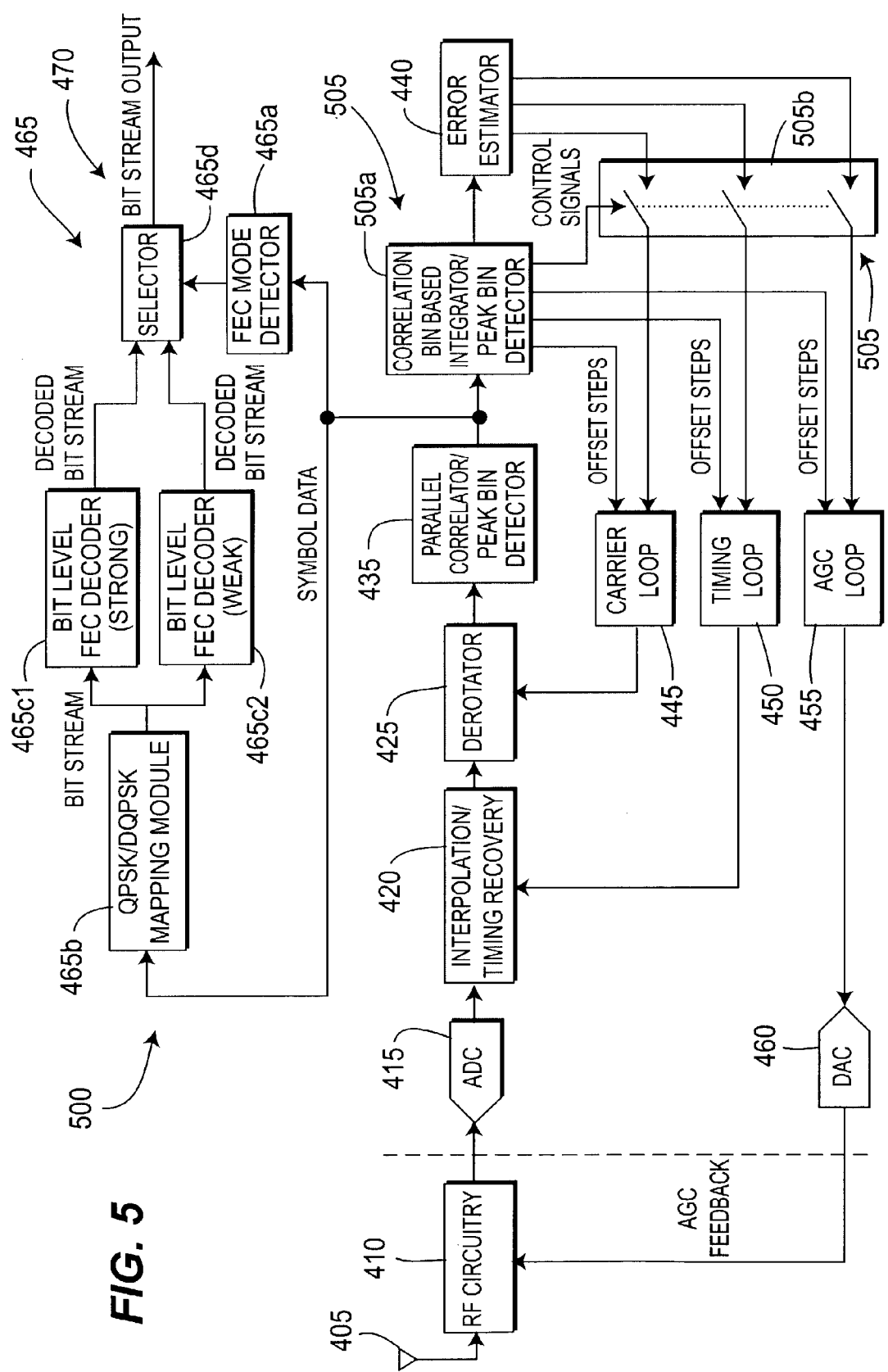
FIG. 5 is a block diagram illustrating a Time Division Multiple Access (TDMA) receiver 500 that employs correlation bin based averaging, according to an illustrative embodiment of the present invention.

FIG. 5 is a block diagram illustrating a Time Division Multiple Access (TDMA) receiver 500 that employs correlation bin based averaging, according to an illustrative embodiment of the present invention. The averaging/integration is now done after the correlations, i.e., the correlation bins instead of the received samples are averaged. The averaged correlation peaks are now used to estimate the error signals needed for all three feedback loops (CTL 445, STR loop 450, AGC loop 455). In this configuration, an additional parallel correlator is not required.

The TDMA receiver 500 includes an antenna 405, RF circuitry 410, ADC 415, interpolation/timing recovery module 420, derotator 425, parallel correlator/peak bin detector 435, a correlation bin based integrator/peak bin detector apparatus 505, error estimation module 440, CTL 445, STR loop 450, AGC loop 455, and DAC 460. It is to be appreciated that while a single ADC and DAC are shown in FIG. 5, more than one ADC and/or DAC may also be employed, while maintaining the spirit and scope of the present invention. The correlation bin based integrator/peak bin detector apparatus 505 includes a correlation bin based integrator/peak bin detector 505a and a plurality of switches 430b. In a preferred embodiment of the present invention, the switches 430b are controlled independent of one another. Of course, other configurations are possible while maintaining the spirit and scope of the present invention.

Moreover, the TDMA receiver 500 includes an FEC mode detection apparatus 465. The FEC mode detection apparatus 465 includes an FEC mode detector 465a, a QPSK/DQPSK mapping module 465b, a bit level FEC decoder (strong) 465c1, a bit level FEC decoder (weak) 465c2, and a selector 465d. The FEC mode detection apparatus 465 also includes the recovery circuit 470.

It is to be appreciated that the implementation of FIG. 5 does not have a by-pass mode and, thus, the correlation bin based integrator/peak bin detector apparatus 505 can operate continuously.

In the illustrative embodiments of FIGS. 4A and 5, two FEC decoders 465c1 and 465c2 are utilized to simultaneously decode the bit stream, one FEC decoder set up for strong mode (465c1) and the other FEC decoder set up for weak mode (465c2). The path having the FEC decoder that gives rise to the smaller or no error rate is deemed the correct path. A determination based on error rate may be made by, e.g., selector 465d.

A more hardware efficient implementation of this approach may also be employed in accordance with another illustrative embodiment of the present invention. For example, a single FEC decoder may be used to decode a packet in both strong and weak mode and store the results. Again, the result with the lowest decoded error would be the proper selection. This approach involves no additional hardware although the approach does require that the single FEC decoder have the ability to operate at twice the bit rate or the bit rate needed to decode with two parallel decoders.

According to another embodiment of the present invention, another approach to determining the FEC mode (strong or weak) is to use the un-encoded symbols in the header to decide the mode by the majority vote. For example, if all positive peaks indicate strong FEC mode and all negative peaks weak FEC mode, then three out of four positive correlation peaks indicate that the strong FEC mode is used by the base station. It should be noted that different patterns can be used for strong and weak modes. The majority vote still applies to a pattern matching scheme. The present invention can improve reliability of the determination of the FEC mode by (1) averaging the correlation bins after de-spreading or received signals before de-spreading, (2) a pair of FEC decoders are employed to decode the bit streams in parallel.

A brief description will now be given of the overall function of the TDMA receivers 400 and 500 shown in FIGS. 4A and 5, respectively. It is to be appreciated that some of the elements of TDMA receivers 400 and 500 will be described in further detail herein below. However, it is to be further appreciated that since many of the elements of the TDMA receivers 400 and 500 are well known to those of ordinary skill in the related art, detailed descriptions of those elements will not be provided herein for purposes of brevity.

The output of the RF circuitry 410 that is at base band (except for residual carrier offset) is sampled (ADC 415) for the in-phase and quadrature-phase streams, IRx and QRx. This data is then correlated and demodulated to generate a data stream in the correct TDMA slot. The demodulator output data is then reformatted into packets, FEC decoded and descrambled and stored in memory to be processed by the upper layers of the system.

A near base band signal is sampled using a fixed clock. This signal is fed to the interpolation/timing recovery module 420 that derives its error from the data past the correlator (parallel correlator/peak bin detector 435a in the case of FIG. 4A, correlation bin based integrator/peak bin detector 505a in the case of FIG. 5). The derotator 425 follows the interpolation/timing recovery module 420. The derotator 425 presents phase corrected chips to the parallel correlator/peak bin detector 435. The symbol stream at the output of the parallel correlator/peak bin detector 435 is fed to the FEC mode detector 465. The detection of the correlation peak will be dependent on the incoming SNR, signal level, carrier and timing offset.

A description will now given of the Carrier Tracking Loop (CTL) 445 shown in FIGS. 4 and 5, according to an illustrative embodiment of the present invention. It is to be appreciated that the following description is provided for illustrative purposes and, thus, modifications thereto may be readily made by one of ordinary skill in the related art while maintaining the spirit and scope of the present invention.

There are two stages of residual carrier recovery in the digital domain. The first stage includes applying a sweep ahead of the parallel correlator/peak bin detector 435 to center the signal so that the output of the parallel correlator/peak bin detector 435 will have distinct peaks usable for signal detection and generation of meaningful carrier and timing errors. In a preferred embodiment of the present invention, the stepping up and/or down of the carrier offset values is controlled by a microcontroller that sets up the values in state machines; the state machines control the operations of the hardware (e.g., CTL 445, VSTR 900 described below). Of course, other arrangements, readily contemplated by one of ordinary skill in the related art, may be employed while maintaining the spirit and scope of the present invention.

The CTL 445 is responsible for removing any residual frequency and phase offset from the input signal. On initialization, the CTL 445 may be so far off in frequency that a correlation peak cannot be found. In order to make the carrier offset smaller, a sweep is initiated at the receiver side (at the handset). This is accomplished digitally using the CTL numerically controlled oscillator (NCO) 625 shown below with respect to FIG. 6. Once the carrier is acquired, the outboard transmitter can then be pre-compensated for the end to end carrier offset in the TDMA system to aid the receiver on the other end (in this case the base) to acquire the signal more rapidly since it will be almost dead on in frequency and will only have to track the phase with its CTL.

Figure 6:
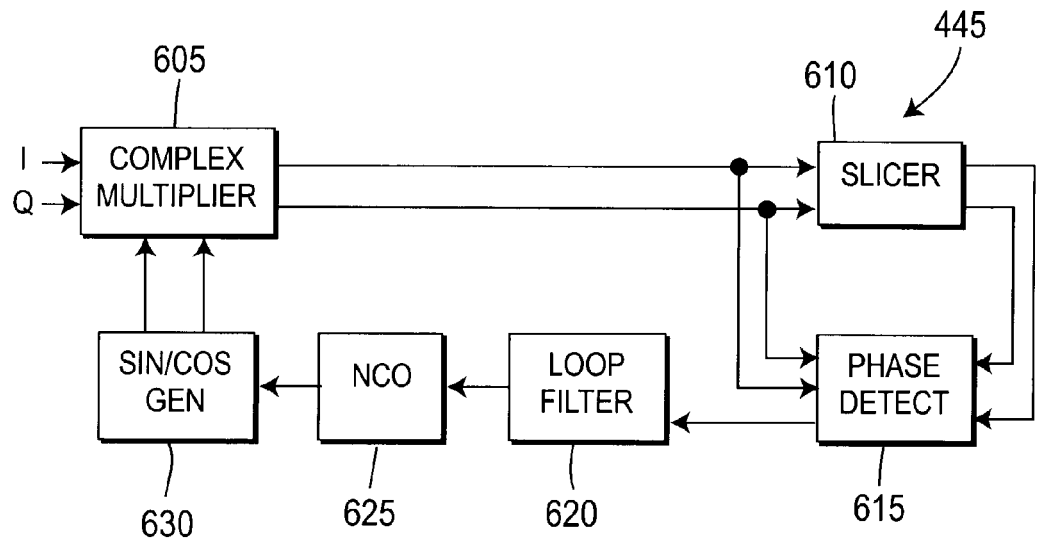
FIG. 6 is a block diagram illustrating the Carrier Tracking Loop (CTL) 445 of FIGS. 4 and 5, according to an illustrative embodiment of the present invention.

Preferably, the CTL 445 is an all digital implementation that does not require feedback to the tuner (not shown). FIG. 6 is a block diagram illustrating the Carrier Tracking Loop (CTL) 445 of FIGS. 4 and 5, according to an illustrative embodiment of the present invention. The CTL 445 includes a complex multiplier 605, a slicer 610, a phase detector 615, a loop filter 620, a Numerically Controlled Oscillator (NCO) 625, and sine/cosine (SIN/COS) value generator 630.

The basic operation of the CTL 445 is similar to a phase locked loop. In normal operation, the closed loop includes the complex multiplier 605, phase detector 615, loop filter 620, NCO 625, and SIN/COS value generator 630. The difference between the input and the output of the slicer 610 is used to calculate the phase errors that are fed into a loop filter. These errors are then used to generate the correct sine/cosine waves to de-rotate the received signals so that the frequency offset is removed. The loop dynamics are controlled in various locations by programmable gain settings.

A description will now be given of the loop filter 620 employed in the Carrier Tracking Loop (CTL) 445 shown in FIGS. 4 and 5, according to an illustrative embodiment of the present invention. It is to be appreciated that the loop filter 620 may also be employed in the Symbol Timing Recovery (STR) loop 450 shown in FIGS. 4 and 5.

Figure 7:
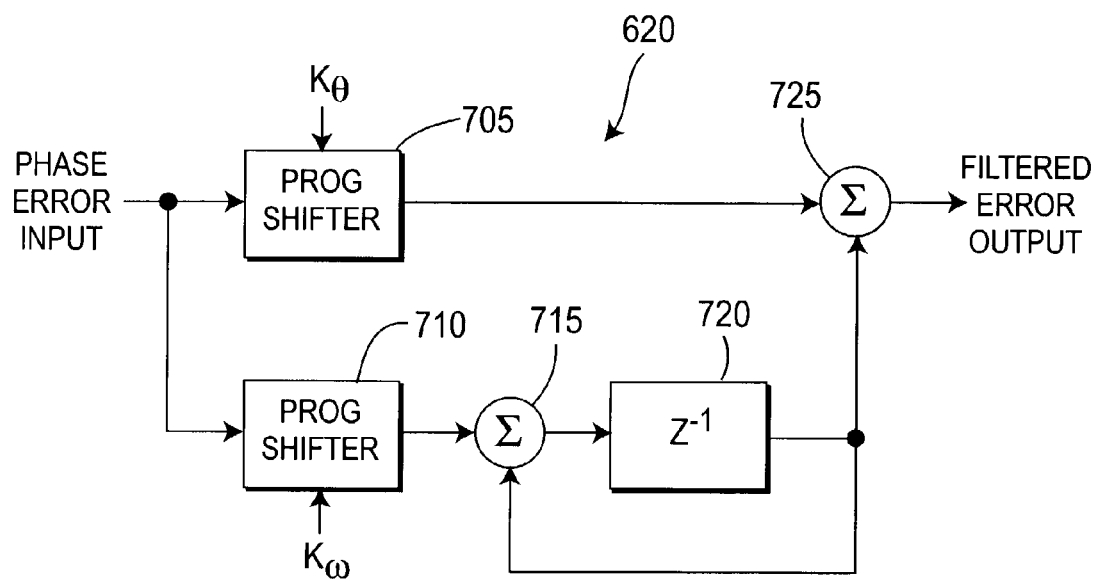
FIG. 7 is a block diagram illustrating the loop filter 620 shown in FIG. 6, according to an illustrative embodiment of the present invention.

The loop filter 620 is a second order filter constructed with a proportional path and an integrator path. The use of a second order filter allows an offset frequency to be tracked with no phase error. There are two gain constants, $K_\theta$ and $K_\omega$, which can be adjusted. In the illustrative embodiment of FIG. 7, multipliers are implemented as shifters (705 and 710) so that the multiplication factors are always a power of 2 ("$K\theta$*Error signal" is implemented by right or left shifting the error signal according to the value of $K\theta$). FIG. 7 is a block diagram illustrating the loop filter 620 shown in FIG. 6, according to an illustrative embodiment of the present invention. The loop filter 620 includes a first programmable shifter 705, a second programmable shifter 710, an adder 715, a delay 720, and an adder 725.

The loop bandwidth is primarily set by the absolute gain and the response shape (e.g., damping) is primarily set by the $K_\theta/K_{107}$ ratio. This ratio also plays a role in the stability (i.e., phase margin) of the loop. As the ratio becomes larger, the loop becomes more stable. At the limit, as $K_\theta$ becomes dominant, the loop filter approaches the response of a first order loop. Under normal conditions, a first order loop is unconditionally stable. This fact does not hold if there are delays in the loop.

Figure 8:
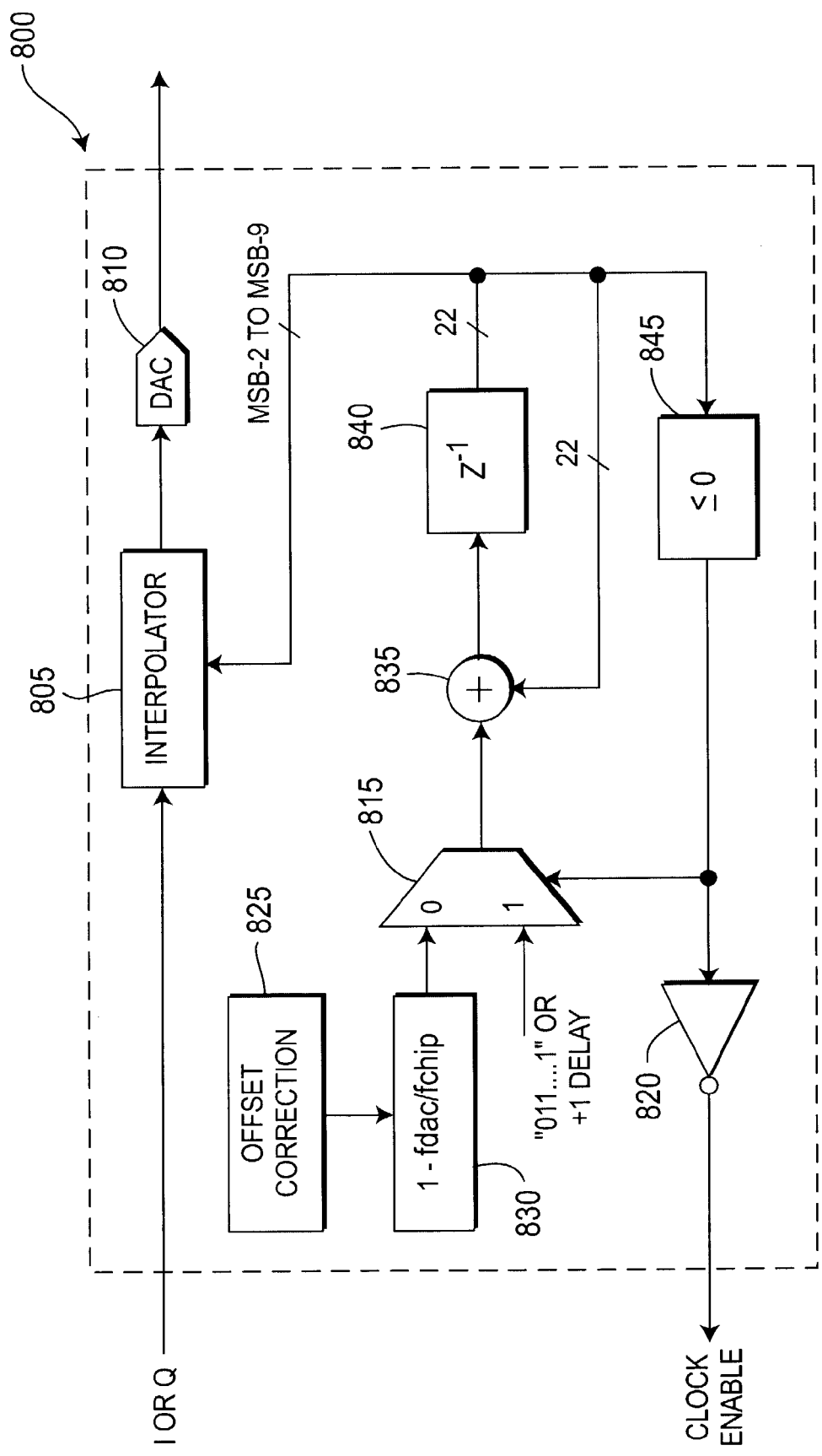
FIG. 8 is a block diagram illustrating a sample rate converter 800 included in the interpolation/timing recovery module 420 of FIGS. 4 and 5, according to an illustrative embodiment of the present invention.

FIG. 8 is a block diagram illustrating a sample rate converter 800 included in the interpolation/timing recovery module 420 of FIGS. 4 and 5, according to an illustrative embodiment of the present invention. It is to be appreciated that FIG. 8 illustrates sample rate conversion as well as clock enable generation. The sample rate converter 800 includes: an interpolator 805; a DAC 810; a multiplexer 815; an inverter 820; an offset correction module 825; arithmetic unit 830 ($1-f_{dac}/f_{chip}$, where $f_{dac}$ is the clock rate for DAC 810 and $f_{chip}$ is the chipping (de-spreading) rate); an adder 835; a delay (e.g., one clock period) 840; and a comparator 845.

The inputs to the sample rate converter 800 include the frequency at which the DAC is running, $f_{DAC}$, and the chip frequency, $f_{chip}$, that determine the ratio at which the clock enable signals need to be generated. At the base, the transmit clock is free running and is not pegged to any other reference in the TDMA system. However, in the handset, an offset correction term is derived to peg the transmit clock frequency to the received clock frequency. This correction term is computed based on the status of a loop filter integrator (not shown) in the timing recovery loop on the receiver side. The offset correction term relates to an offset away from the nominal clock frequency setting in the receiver chain with respect to the transmit symbol rate. Based on this, the transmitter side of the base station needs a correction term to be applied to its nominal clock rate setting. Thus, the return transmit link (i.e. from the handset to the base) is frequency locked in symbol rate to the transmitted symbol rate.

A description will now be given of receiver clock generation and timing recovery, according to an illustrative embodiment of the present invention. The receiver clock is derived from the incoming signal and operates in the normal closed loop fashion of a Variable Symbol Timing Recovery (VSTR) loop with interpolation.

Thus, a Variable Symbol Timing Recovery (VSTR) circuit is responsible for receiving samples from ADC 415 at the sampling rate and generating samples at twice the chip rate. In addition, the output samples are phase locked such that the samples occur at the 0 ISI point and halfway between the 0-ISI points. This method of timing recovery is all digital and uses an interpolator to obtain data points which were not physically sampled by the ADC 415. This allows the receiver circuitry to run off a fixed master oscillator since timing adjustment is done digitally internal to the IC. The VSTR circuit has 2 basic functions. The first function is an interpolating filter and the second function is the symbol timing error detector. The symbol timing error detector is used to control the interpolating point within the interpolator.

Figure 9:
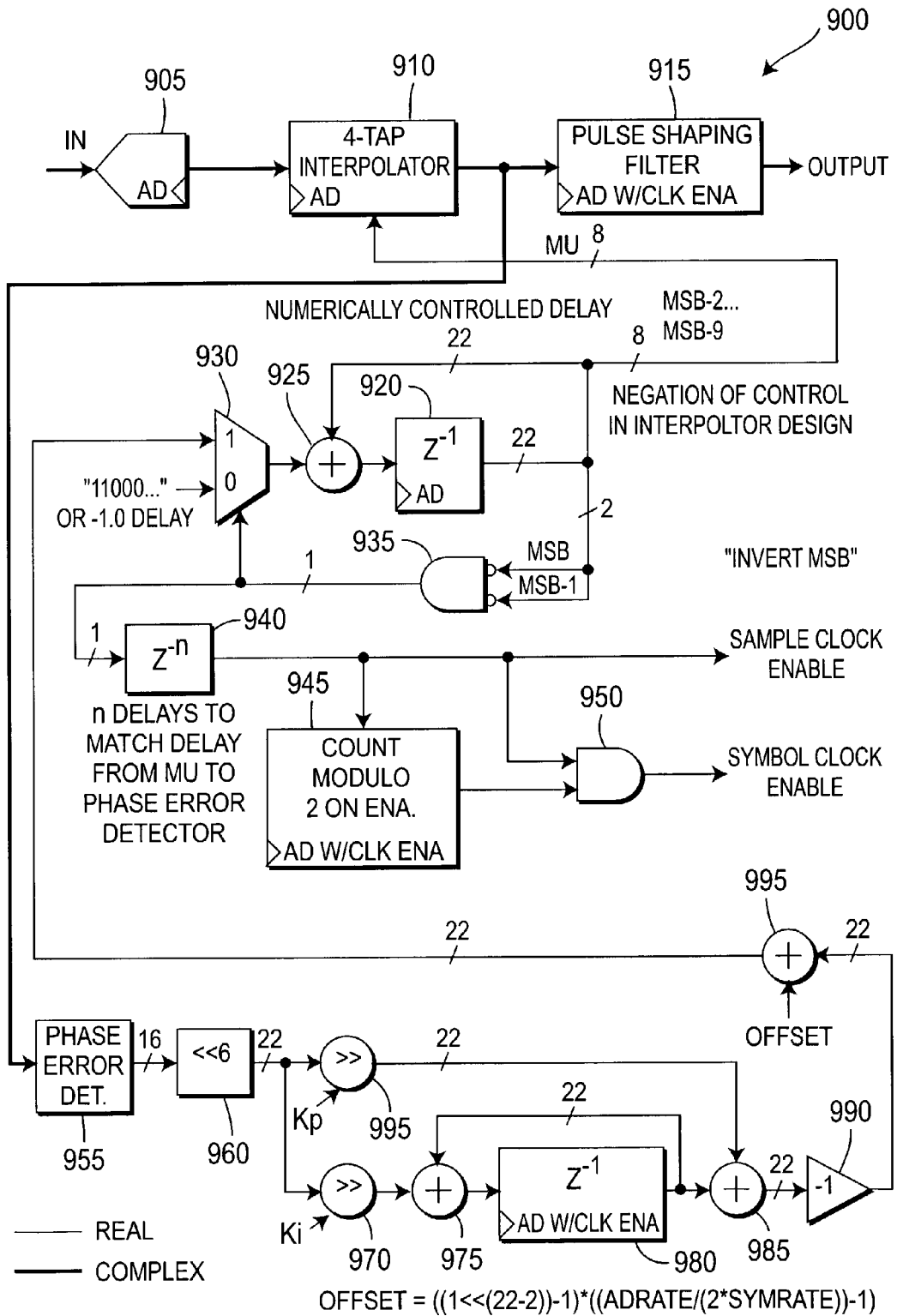
FIG. 9 is a block diagram illustrating Variable Symbol Timing Recovery (VSTR) circuit 900, according to an illustrative embodiment of the present invention.

FIG. 9 is a block diagram illustrating Variable Symbol Timing Recovery (VSTR) circuit 900, according to an illustrative embodiment of the present invention. According to the illustrative embodiment of FIG. 9, the VSTR circuit 900 depicted therein spans the CTL 445, the interpolation/timing recovery module 420, and the error estimation module 440 shown in FIGS. 4A and 5.

The VSTR circuit includes: a 4-tap interpolator 910; a pulse shaping filter 915; a delay 920, an adder 925; a multiplexer 930; a NAND gate 935; a delay (e.g., n clock periods) 940; modulo 2 counter 945; an AND gate 950; a phase error detector 955; a shifter (e.g., shift left by six bits and append six zeros at Least Significant Bits (LSBs) so that 16-bit input becomes 22 bit output) 960; a programmable shifter 965; a programmable shifter 970; an adder 975; a delay 980; an adder 985; an inverter 990; and an adder 995. It is to be appreciated that a Numerically Controlled Delay (NCD) is formed by the following combination of elements: delay 920, adder 925, multiplexer 930, NAND gate 935, delay 940, counter 945, and AND gate 950.

The VSTR circuit 900 is initially setup using an offset value. This value should be as close as possible to the correct sampling to symbol rate ratio as possible. Based on the settings of the loop filter 620, the VSTR circuit 900 can pull in the correct symbol rate up to several hundred parts per million.

Figure 10:
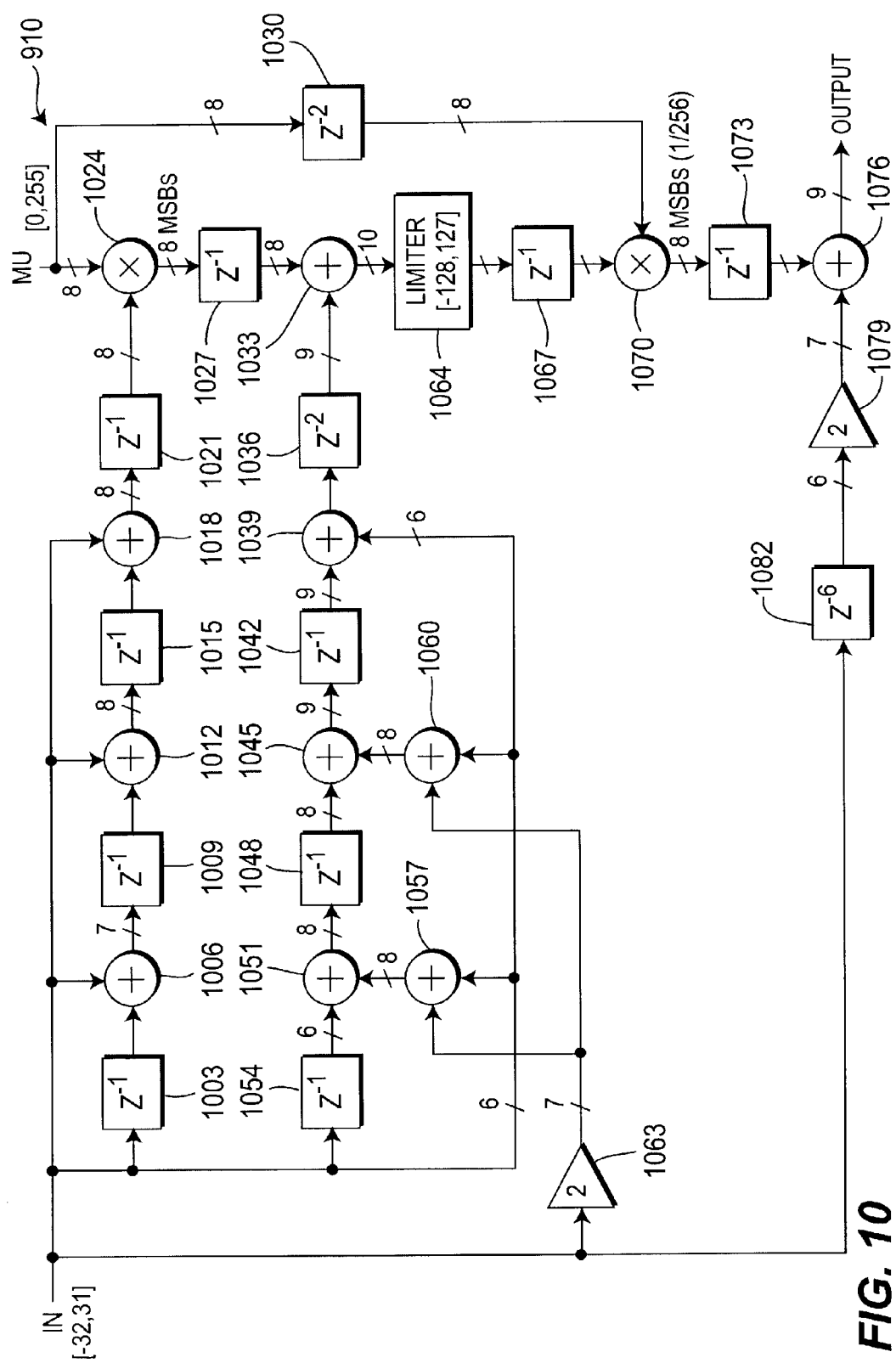
FIG. 10 is a block diagram of the 4-tap interpolator 910 included in the VSTR circuit 900 of FIG. 9, according to an illustrative embodiment of the present invention.

The VSTR circuit 900 uses the 4-tap Farrow interpolator 910 to obtain data points that were not physically sampled by the A/D. FIG. 10 is a block diagram of the 4-tap interpolator 910 included in the VSTR circuit 900 of FIG. 9, according to an illustrative embodiment of the present invention. The interpolator 910 is specifically included in the portion of the VSTR circuit 900 that spans the interpolator/timing recovery module 420 of FIGS. 4 and 5.

The interpolator 910 includes: a delay 1003; an adder 1006; a delay 1009; an adder 1012; a delay 1015; an adder 1018; a delay 1021; a mixer 1024; a delay 1027; a delay 1030; an adder 1033; a delay 1036; an adder 1039; a delay 1042; an adder 1045; a delay 1048; an adder 1051; a delay 1054; an adder 1057; an adder 1060; a multiplier 1063; a limiter 1064; a delay 1067; a mixer 1070; a delay 1073; an adder 1076; a multiplier 1079; and a delay 1082.

It is to be appreciated that in the interpolator 910 circuit there is a 3 clock delay from MU in to output. The clock enable signal must be delayed to reflect this delay. The delay from MU to output must match the delay from the Numerically Controlled Delay (NCD) to the system clock enable.

The inputs to the interpolator 910 include the input (I or Q) signal and a MU value between 0 and 255. The output of the interpolator 910 is a 9 bit interpolated value.

The Symbol Timing Recovery (STR) loop 450 is responsible for generating the MU value required by the interpolator 910. The STR loop 450 uses a 2 sample per symbol (s/s) algorithm to generate the timing offset error. The benefit of the 2 s/s algorithm is that is immune to I/Q phase offset. It is not totally immune to frequency offset, but is insensitive to frequency offsets in any normal operating range.

Figure 11:
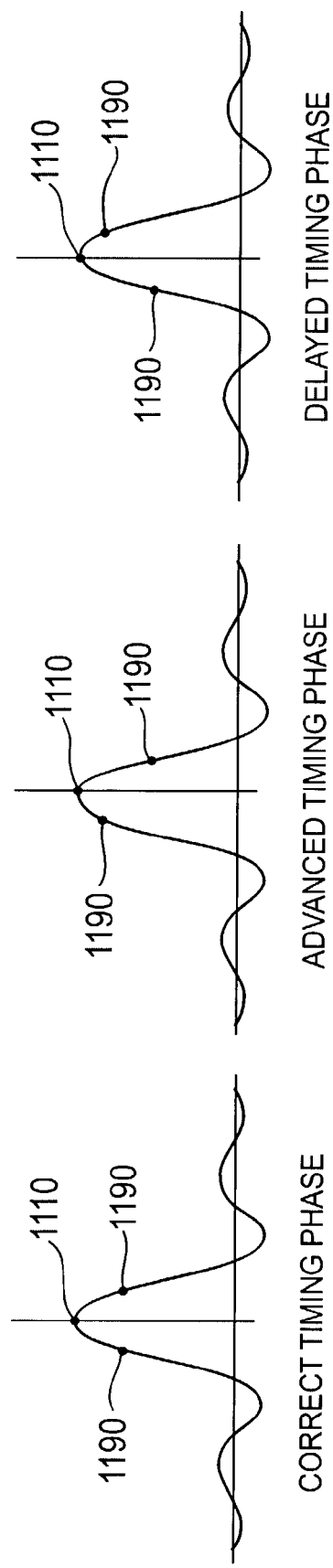
FIGS. 11A, 11B, and 11C are plots of correlation peak sampling versus timing error for the cases of correct timing phase, advanced timing phase, and delayed timing phase, respectively, according to an illustrative embodiment of the present invention.

The chip timing estimate for the TDMA system is based on sampling the peak of the de-spreading correlation. FIGS. 11A, 11B, and 11C are plots of correlation peak sampling versus timing error for the cases of correct timing phase, advanced timing phase, and delayed timing phase, respectively, according to an illustrative embodiment of the present invention. The parallel correlator/peak bin detector 435 detects the largest value in the sequence (1110 in FIGS. 11A–C), and the difference between the two adjacent bins (1190 in FIGS. 11A–C) is used for the error measurement. These are indicated as ±1 index from the peak bin index. With the crystal timing reference at the base and in the handset, only 100 ppm drift is expected between timing references. This implies some consistency in the correlation peak of a length 16 code over several symbols. In noisy conditions, a signal detector block state machine in the parallel correlator/peak bin detector 435 is used to ensure that the peak is consistent from symbol to symbol. Lack of consistency would indicate lack of a signal or presence of strong interference.

A description will now be given of the Automatic Gain Control (AGC) loop 455 shown in FIGS. 4 and 5, according to an illustrative embodiment of the present invention. The AGC loop 455 is used to maintain the proper gain for the received signal at the input of the RF circuitry 410. The outputs of the parallel correlator/peak bin detector 435 in the case of FIG. 4A and the outputs of the correlation bin based integrator/peak bin detector 505 in the case of FIG. 5 are used to estimate the gain for the analog amplifier in the RF circuitry 410. The outputs of the digital AGC loop 455 are converted to analog signals by DAC 460.

At the handset, the AGC loop 455 will have to again keep track of only its particular link to the base. The AGC loop 455 is aided by a base controlled power level mechanism. Initially, the AGC loop 455 kicks in at the handset after the TDMA slots have been established. This, of course requires a correlation peak to be detected. This is because the correct signal needs to be identified to which we need to establish the correct power levels. The error for the AGC loop 455 is also derived past the parallel correlator/peak bin detector 435 so that the gain of the parallel correlator/peak bin detector 435 is exploited.

A description will now be given of an initial signal acquisition by a TDMA receiver, according to an illustrative embodiment of the present invention. First, the CTL 445 is enabled to establish an initial carrier lock (i.e., to obtain valid correlation peaks). These correlation peaks may be "crude" due to an unknown amount of timing offset and additive noises. The averaging method of the present invention can be applied at this stage. It is to be appreciated the AGC gain is adjusted in the CTL 445 to ensure that the proper amount of signal energy is digitized by the front end ADC 415.

Second, when valid correlation peaks have been detected, the STR loop 450 and the averaging block (sample based integrator apparatus 430 in the case of FIG. 4 and correlation bin based integrator/peak bin detector apparatus 505) can be enabled to work in concert to improve the performance and secure the CTL 445 and STR loop 450 locks. The steps of establishing a carrier lock to obtain valid correlation peaks and the enabling the STR loop 450 and the averaging block can be can be repeated by using different amounts of timing offset (MU) injected into STR loop 450.

When the averaging block (sample based integrator apparatus 430 in the case of FIG. 4 and correlation bin based integrator/peak bin detector apparatus 505) is turned on, it is assumed that the frequency offset value is relatively small to the chip rate (typically, the spreading rate is in the MHz range while the frequency offset is in the KHz range). This is a very reasonable and practical assumption. However, the averaged duration may not be too long which is always the case during the very initial acquisition. Once the receiver is in the tracking mode, the duration of the averaging can be longer to aid in maintaining the link under an environment of very low SNR and significant interference.

Figure 12:
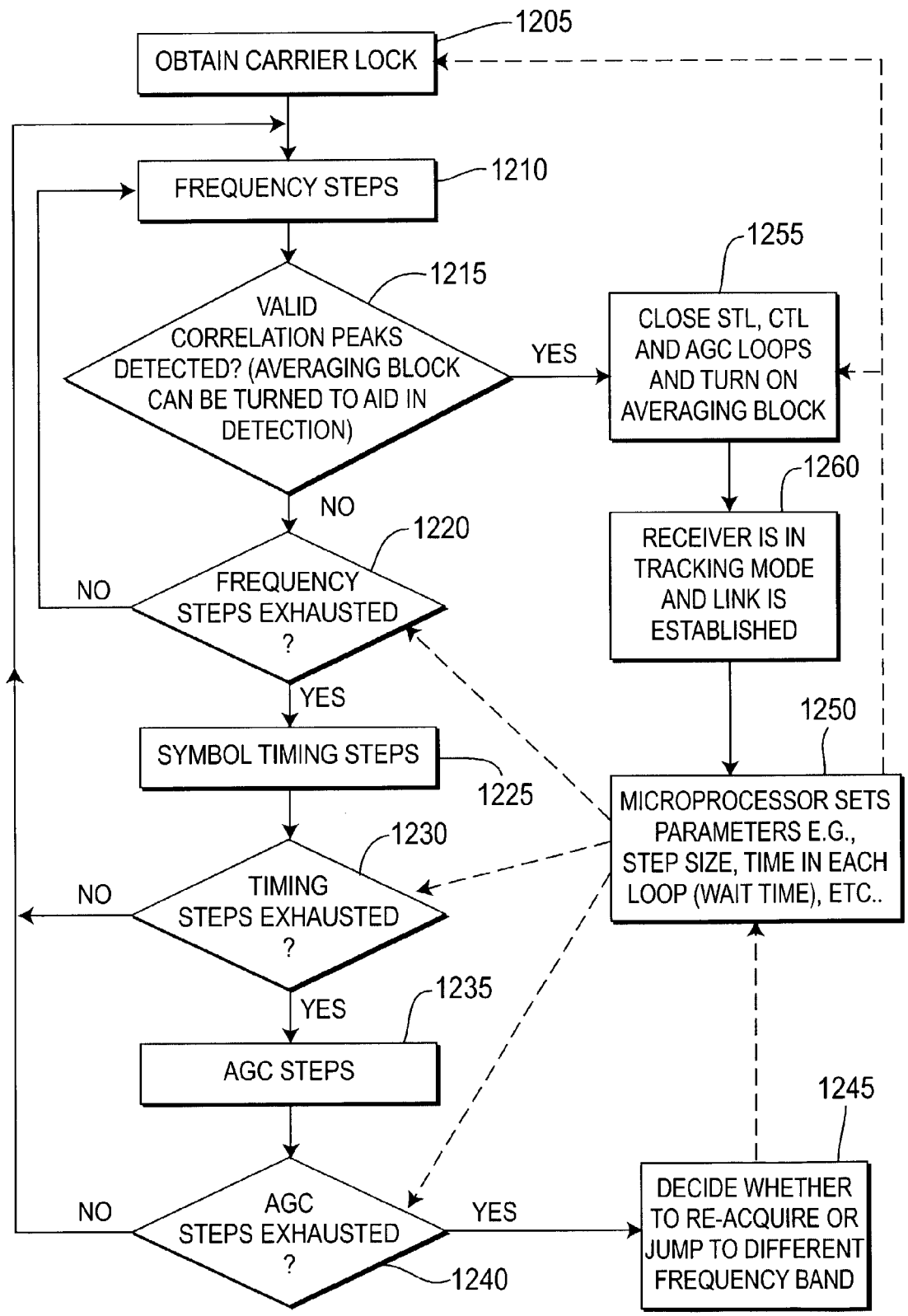
FIG. 12 is a flow diagram illustrating an initial signal acquisition by a TDMA receiver, according to an illustrative embodiment of the present invention.

FIG. 12 is a flow diagram illustrating an initial signal acquisition by a TDMA receiver, according to an illustrative embodiment of the present invention. The TDMA receiver is a TDMA receiver such as that shown in any one of FIGS. 4A and 5.

An initial carrier lock is obtained by the TDMA receiver (step 1205). The frequency offset of the carrier signal is adjusted by one of a plurality of frequency steps (step 1210). It is then determined whether any valid correlation peaks have been detected (step 1215). If not, then it is determined whether all of the frequency steps have been exhausted (step 1220). If not, then the method returns to step 1210.

Otherwise, a timing offset (MU) of the carrier signal is adjusted by one of a plurality of timing steps (step 1225). It is then determined whether all of the timing steps have been exhausted (step 1230). If not, then the method returns to step 1210.

Otherwise, the AGC is adjusted by one of a plurality of gain steps (step 1235). It is then determined whether all of the gain steps have been exhausted (step 1240). If not, then the method returns to step 1210.

Otherwise, it is determined whether to re-acquire the carrier lock or jump to another frequency (step 1245). Parameters corresponding to at least one of frequency, timing, and gain are adjusted based on a result of the determination made at step 1245 (step 1250), and the method proceeds to step 1255 when the result of the determination made at step 1245 is to jump to another frequency or the method returns to step 1205 when the result of the determination made at step 1245 is to re-acquire the carrier lock.

Returning to step 1215, if valid correlation peaks are detected, then the CTL 445, STR loop 450, and the AGC loop 455 are closed and the averaging block is enabled (step 1255). The receiver is then in tracking mode, the carrier lock is established (step 1260), and the method returns to step 1250.

Figure 13:
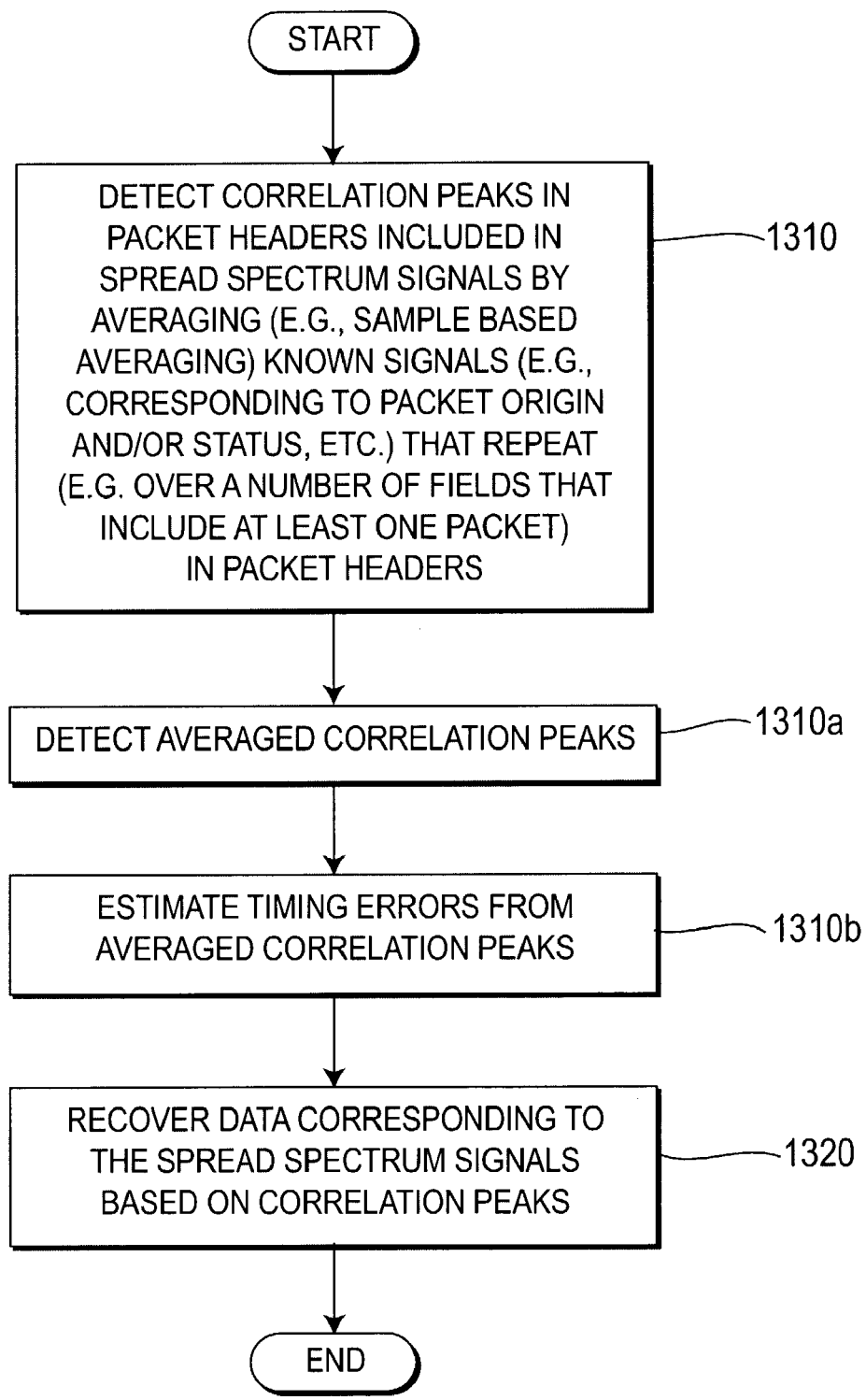
FIG. 13 is a flow diagram illustrating a method for correlating spread spectrum signals, according to an illustrative embodiment of the present invention.

FIG. 13 is a flow diagram illustrating a method for correlating spread spectrum signals, according to an illustrative embodiment of the present invention. Correlation peaks are detected in packet headers included in the spread spectrum signals by averaging (e.g., sampled-based averaging) known signals that repeat in the packet headers (e.g., over a number of fields that each include at least one packet) (step 1310). Examples of known signals that repeat in packet headers include, but are not limited to, signals corresponding to packet origin (e.g., packet transmitted by base station or other mobile unit, etc.), signals corresponding to packet status (e.g., FEC status, etc.), and so forth. It is to be appreciated that step 1310 may include the steps of detecting averaged correlation peaks (step 1310*a*) and estimating timing errors from the averaged correlation peaks (step 1310*b*).

Data (i.e., the underlying information that was spread with a known PN sequence or chips) corresponding to the spread spectrum signals is recovered based on the correlation peaks (step 1320). Step 1320 may include the step of de-spreading the spread spectrum signals with the known PN sequence or chips to recover the transmitted signals that are spread with the same known PN sequence or chips.

Figure 14:
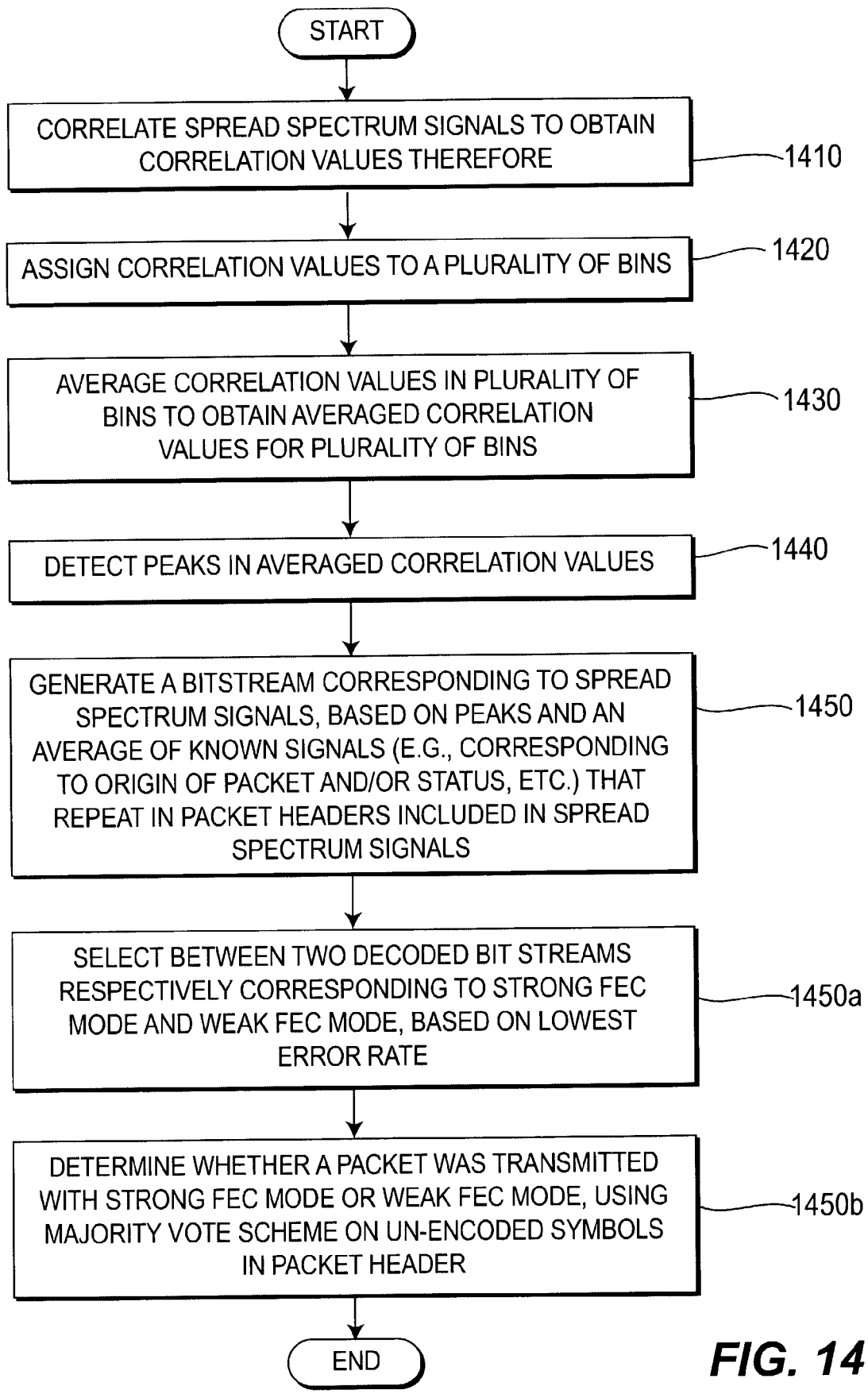
FIG. 14 is a flow diagram illustrating a method for correlating spread spectrum signals, according to another illustrative embodiment of the present invention.

FIG. 14 is a flow diagram illustrating a method for correlating spread spectrum signals, according to another illustrative embodiment of the present invention.

The spread spectrum signals are correlated to obtain correlation values therefore (step 1410). The correlation values are assigned to a plurality of bins (step 1420).

The correlation values in the plurality of bins are averaged to obtain averaged correlation values for the plurality of bins (step 1430). Peaks in the averaged correlation values are detected (step 1440).

A bit stream corresponding to the spread spectrum signals is generated, based on the peaks and an average of known signals (e.g., corresponding to FEC mode) that repeat in packets headers included in the spread spectrum signals (step 1450). It is to be appreciated that in the event that at least some of the known signals correspond to the FEC mode of the spread spectrum signals, then step 1450 may include steps 1450*a* and/or 1450*b*.

At step 1450*a*, a selection is made between two decoded bit streams respectively corresponding to a strong mode FEC and a weak mode FEC, based on lowest error rate. At step 1450*b*, it is determined whether a packet was transmitted with a strong FEC mode or a weak FEC mode, using a majority vote scheme on un-encoded symbols in the packet header.

A description will now be given of some of the many advantages of the present invention. Averaging of the known transmitted symbols can achieve high reliability of correlation peak detection of the packet header and, hence, the start of the packet. Better estimation of timing errors can be obtained from the averaged correlation peaks. Sample based averaging is employed. Correlation bin based averaging can be employed. Moving average can be applied to both sample-based and correlation bin based averaging. A pair of FEC decoders can be used to decode the bit stream in parallel or a single FEC decoder can be used that runs at twice the bit rate. The correct decoded bits output can be determined with or without knowing the FEC mode transmitted by the base station.

Although the illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A correlation method for spread spectrum signals, comprising the steps of:
   detecting correlation peaks in packet headers included in the spread spectrum signals by averaging known signals that repeat in the packet headers; and
   recovering the spread spectrum signals based on the correlation peaks to determine a start of a received packet,
   wherein the known signals correspond to an origin of a given packet and a status of the given packet.

2. The method of claim 1, wherein said detecting step comprises the step of detecting avenged correlation peaks, and said method further comprises the step of estimating timing errors from the averaged correlation peaks.

3. The method of claim 1, wherein said detecting step employs sample-based averaging.

4. The method of claim 1, wherein said detecting step is performed over a number of fields, each of the fields comprising at least one packet.

5. The method of claim 1, wherein the number of fields is dynamically adjustable.

6. The method of claim 1, wherein the status of the given packet corresponds to an FEC stats of the given packet.

7. The method of claim 1, wherein said detecting step comprises the step of artificially injecting a timing error into the spread spectrum signals to aid in the detection of the correlation peaks.

8. A correlation method for spread spectrum signals, comprising the step of:
   correlating the spread spectrum signals to obtain correlation values therefore;
   assigning the correlation values to a plurality of bins;
   averaging the correlation values in the plurality of bins to obtain averaged correlation values for the plurality of bins;
   detecting peaks in the averaged correlation values; and
   generating a bit stream corresponding to the spread spectrum signals, based on the peaks and an average of known signals that repeat in packet headers included in the spread spectrum signals,
   wherein the known signals correspond to a Forward Error Correcting (FEC) mode of the spread spectrum signals.

9. The method of claim 8, wherein said generating step comprises the step of selecting between two decoded bit streams respectively corresponding to a strong mode FEC and a weak mode FEC, based on lowest error rate.

10. The method of claim 8, wherein said detecting step comprises the step of deciding whether a packet was transmitted with a strong FEC mode or a weak FEC mode, using a majority vote scheme on un-encoded symbols in the packet header.

11. An apparatus for correlating spread spectrum signals, comprising:
   an integrator for detecting correlation peaks in packet headers included in the spread spectrum signals by averaging known signals that repeat in the packet headers; and
   a recovery circuit for recovering data corresponding to the spread spectrum signals based on the correlation peaks to determine a start of a packet,
   wherein the known signals correspond to an origin of a given packet and a status of the given packet.

12. The apparatus of claim 11, wherein said integrator detects averaged correlation peaks, and said apparatus further comprises an estimator for estimating timing errors from the averaged correlation peaks.

13. The apparatus of claim 11, wherein said integrator employs sample-based averaging.

14. The apparatus of claim 11, wherein said integrator averages the known signals over a number of fields, each of the fields comprising at least one packet.

15. The apparatus of claim 11, wherein the number of fields is dynamically adjustable.

16. The apparatus of claim 11, wherein the status of the given packet corresponds to an FEC status of the given packet.

17. An apparatus for correlating spread spectrum signals, comprising:
   a correlator for correlating the spread spectrum signals to obtain correlation values therefor and for assigning the correlation values to a plurality of bins;
   an integrator for averaging the correlation values in the plurality of bins to obtain averaged correlation values for the plurality of bins;
   a detector for detecting peaks in the averaged correlation values; and
   a decoder for generating a bit stream corresponding to the spread spectrum signals, based on the peaks and an average of known signals that repeat in packet headers included in the spread spectrum signals,
   wherein the known signals correspond to a Forward Error Correcting (FEC) mode of the spread spectrum signals.

18. The apparatus of claim 17, further comprising a selector for selecting between two decoded bit streams respectively corresponding to a strong mode FEC and a weak mode FEC, based on lowest error rate.

19. The apparatus of claim 17, further comprising an FEC mode detector for deciding whether a packet was transmitted with a strong FEC mode or a weak FEC mode, using a majority vote scheme on un-encoded symbols in the packet header.

* * * * *